United States Patent
Fujii et al.

(10) Patent No.: US 8,115,907 B2
(45) Date of Patent: Feb. 14, 2012

(54) CONTAINER AND EXPOSURE APPARATUS HAVING THE SAME

(75) Inventors: Hirofumi Fujii, Utsunomiya (JP); Mitsuo Nishimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 460 days.

(21) Appl. No.: 12/357,498

(22) Filed: Jan. 22, 2009

(65) Prior Publication Data

US 2009/0179066 A1    Jul. 16, 2009

Related U.S. Application Data

(62) Division of application No. 11/275,769, filed on Jan. 27, 2006, now Pat. No. 7,525,644.

(30) Foreign Application Priority Data

Feb. 10, 2005    (JP) .................................. 2005-034404

(51) Int. Cl.
*G03B 27/32* (2006.01)
*G03B 15/00* (2006.01)
(52) U.S. Cl. ........................................ 355/77; 355/133
(58) Field of Classification Search .................... 355/53, 355/72–77, 133; 430/5, 20, 30
See application file for complete search history.

(56) References Cited

U.S. PATENT DOCUMENTS

| | | | |
|---|---|---|---|
| 6,570,644 B2 * | 5/2003 | Binnard et al. | 355/72 |
| 6,972,499 B2 | 12/2005 | Emoto | 310/12 |
| 7,245,092 B2 | 7/2007 | Ohishi | 318/135 |
| 2002/0113498 A1 | 8/2002 | Emoto | 310/12 |
| 2002/0180945 A1 | 12/2002 | Binnard et al. | 355/72 |
| 2005/0052143 A1 | 3/2005 | Ohishi | 318/135 |
| 2006/0174837 A1 | 8/2006 | Fujii et al. | 118/733 |

FOREIGN PATENT DOCUMENTS

| | | |
|---|---|---|
| JP | 5-248593 | 9/1993 |
| JP | 2001315774 | * 11/2001 |

* cited by examiner

*Primary Examiner* — Hung Henry Nguyen
(74) *Attorney, Agent, or Firm* — Fitzpatrick, Cella, Harper & Scinto

(57) ABSTRACT

A method of forming a container having a lid and a container body which define an inside space, and a material containing an organic compound provided in the inside space. The method includes forming a groove and a communication member for communicating the groove with an outside space, in at least one of the lid and the container body, providing the material in the inside space, welding the lid and the container body to each other, and exhausting the organic compound vaporized by welding heat to the outside space through the groove and the communication member.

4 Claims, 8 Drawing Sheets

CONTAINER AND EXPOSURE APPARATUS HAVING THE SAME

This application is a divisional application of U.S. patent application Ser. No. 11/275,769, filed Jan. 27, 2006, which was published as U.S. Patent Application Publication No. 2006/0174837 on Aug. 10, 2006, and which issued as U.S. Pat. No. 7,525,644 on Apr. 28, 2009.

This application claims priority from Japanese Patent Application No. 2005-034404, filed Feb. 10, 2005, which is hereby incorporated by reference herein.

FIELD OF THE INVENTION AND RELATED ART

This invention relates to a container for accommodating an article therein and, more particularly, to a container usable in an exposure apparatus, for containing therein a structural member which is to be disposed inside a vacuum chamber.

Recently, in the field of semiconductor exposure apparatus, those exposure apparatuses which use exposure light of a very short wavelength, such as EUV (Extreme Ultraviolet) light, are becoming widely noticed. In such an exposure apparatus, in order to reduce attenuation of exposure light, it is required that the space for exposure be maintained at a high vacuum level. However, there is a possibility of a decrease of vacuum level due to outgassing from structural members, which are disposed in the exposure space.

In consideration of this, and in order to prevent a decrease in the vacuum level, a method has been proposed according to which structural members are disposed inside a container having less outgas, and a resin material is injected into the container to keep the structural members fixed.

When a container having a tightly sealed inside space is going to be produced, conventionally, a container lid and a container body having an opening are welded to each other, to provide an integral container. Since, however, heat is produced by the welding, a portion of a resin material used would be vaporized thereby. Furthermore, gases will be expanded and leaked through the welded portion. This will cause welding defects, such as pinholes or blow holes (gas accumulation).

In order to avoid such welding defects, Japanese Laid-Open Patent Application, Publication No. 05-248593, proposes using a metal plate disposed at an inner side of a welded portion, to thereby reduce the leakage.

SUMMARY OF THE INVENTION

If a structural member is disposed inside a container in accordance with the method disclosed in Japanese Laid-Open Patent Application, Publication No. 05-248593, the vacuum level may be maintained at a level which might be thought to be sufficiently high, as compared with the standard in those days. In the field of exposure apparatuses of recent years, however, a much higher vacuum level and a much higher reliability to the vacuum level are being required.

The present invention has been made to meet these requirements. Specifically, it is an object of the present invention to provide a container with fewer welding defects as compared with conventional containers. More specifically, it is an object of the present invention to provide a container that assures a higher vacuum level and a higher reliability with respect to the vacuum level.

In accordance with an aspect of the present invention, to achieve at least one of the objects described above, there is provided a container, comprising at least two structural members welded to each other to define an inside space, and a sealing material provided in the inside space, wherein at least one structural member of the at least two structural members has a groove formed between a welded portion and the sealing material, and communicating means for communicating the groove and an outside space for the container with each other.

In one preferred form of this aspect of the present invention, the at least two structural members have a lid and a container body with an opening, and the welded portion is defined along an outer periphery of the opening and at a plane where the lid and the container body are opposed to each other.

The groove may be formed in either the container lid or the container body.

The communicating means may include a seal member.

The container may further comprise flowpassage means for producing a flow of a cooling medium between the sealing material and the welded portion.

In accordance with another aspect of the present invention, a processing apparatus comprises a vacuum chamber for performing a predetermined process therein, and at least one structural member to be disposed in the vacuum chamber, wherein the at least one structural member is provided in any one of the containers described above.

In accordance with a further aspect of the present invention, an exposure apparatus comprises a vacuum chamber for performing an exposure process therein, and at least one structural member to be disposed in the vacuum chamber, wherein the at least one structural member is provided in any one of the containers described above.

The at least one structural member may be a portion of a linear motor.

In accordance with a yet further aspect of the present invention, a device manufacturing method is provided, comprising the steps of exposing an object to be exposed, by use of an exposure apparatus as mentioned above, and developing the exposed object.

In accordance with a still further aspect of the present invention, there is provided a method of producing a container having at least two structural members welded to each other to define an inside space and having a sealing material provided in the inside space, the method comprising providing communicating means, between a welded portion and the sealing material, for communicating the inside spade and an outside space of the container with each other, and releasing a gas of the sealing material, which is vaporized by welding heat, toward the outside space.

The method may further comprise a detecting step for detecting leakage of a gas from the inside space of the container by use of the communicating means.

The method may further comprise a shutoff step for shutting off the communicating means.

In accordance with these aspects of the present invention, in a container in which at least two structural members are welded to each other to define an inside space, welding defects are reduced significantly. When a component element is housed in a vacuum ambience by using a container, such as described above, the reliability to a high vacuum level can be improved notably.

These and other objects, features and advantages of the present invention will become more apparent upon a consideration of the following description of the preferred embodiments of the present invention, taken in conjunction with the accompanying drawings.

BRIEF DESCRIPTION OF THE DRAWINGS

FIGS. 2A and 2B illustrate a container according to the first embodiment, wherein FIG. 2A is a sectional view taken along a plane A in FIG. 1, and wherein FIG. 2B is a perspective view.

FIGS. 4A and 4B illustrate a container according to a second embodiment of the present invention, having cooling pipe means provided at a container body side, wherein FIG. 4A is a plan view with a container lid being excluded, and FIG. 4B is a sectional view taken along a line a-a of FIG. 4A.

FIGS. 5A and 5B illustrate an example of a container according to a second embodiment of the present invention, in which cooling pipe means is provided at a container lid side, wherein FIG. 5A is a plan view with a container lid being excluded, and FIG. 5B is a sectional view taken along a line a-a of FIG. 5A.

DESCRIPTION OF THE PREFERRED EMBODIMENTS

Preferred embodiments of the present invention will now be described with reference to the attached drawings.

Embodiment 1

Figure 1:
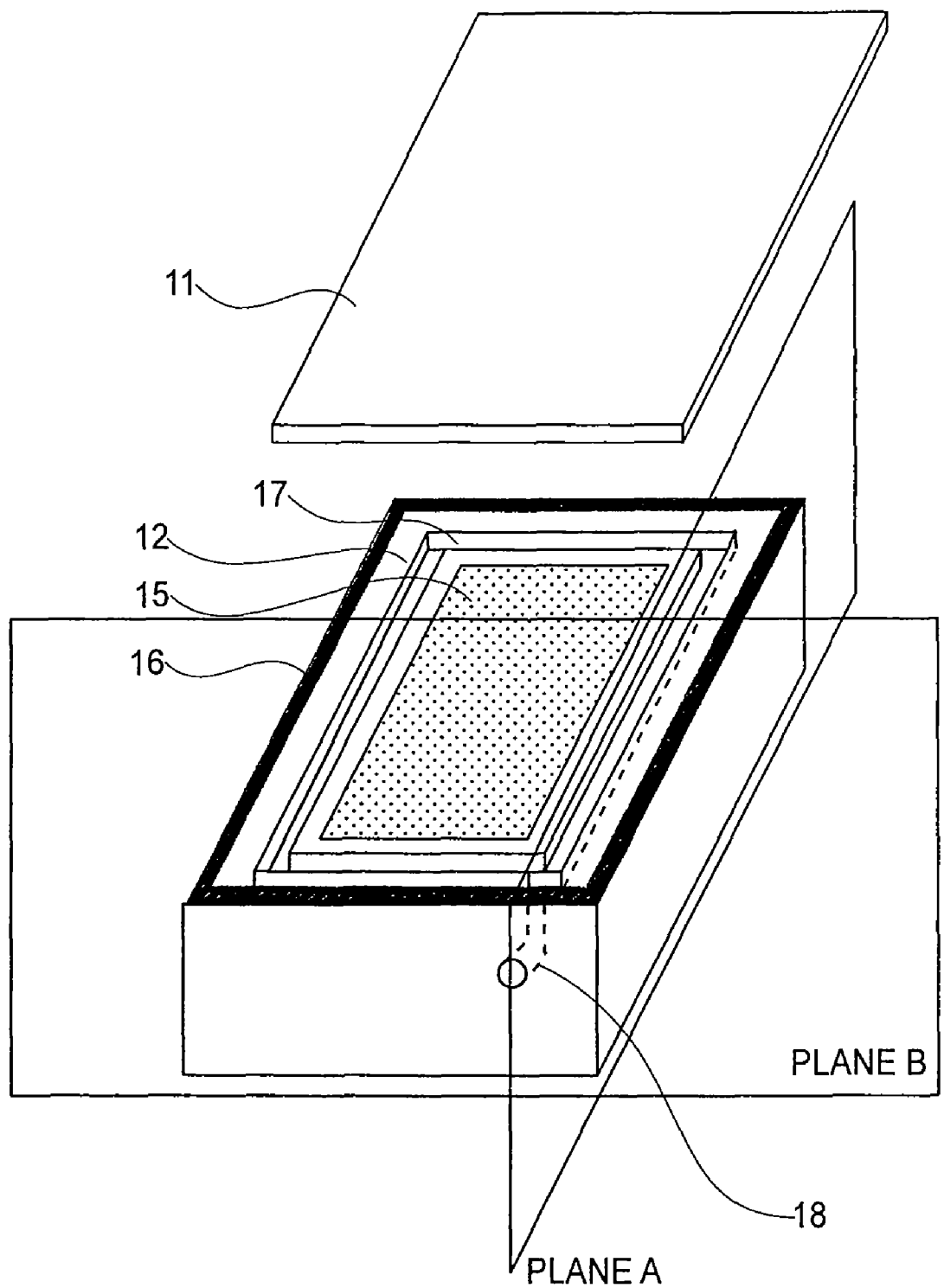
FIG. 1 is a schematic view of a container (structural member) according to a first embodiment of the present invention.

A container according to a first embodiment of the present invention is arranged so that a lid 11 and a body (tray) 12 are welded to each other to thereby define an inside space therein. FIG. 1 is a perspective view that illustrates a lid 11 (weld structural member) and a body 12 (weld structural member) of a container of this embodiment, in a state before they are welded to each other. In the embodiment of FIG. 1, the lid 11 comprises a plate-like member made of stainless steel (SUS), ion, aluminum or copper. As regards the material of the body 12, in order to avoid deformation due to thermal stress during the welding process, the same material as that of the lid 11 is used. The body 12 of the weld structural member has an outer configuration of a rectangular parallelepiped shape, in order to create an inside space, as the same is welded to the lid 11 of the weld structural member. For making such a shape, a metal block may be cut or, alternatively, metal plates may be joined to each other.

If a coil for generating a magnetic field or an electrical field is to be placed within the inside space of the container, then, in order to keep the coil immovable, an organic compound, such as resin, for example, may be used to fix the same. In such a case, during welding of the weld structural member body having a sealing material 15 (e.g., an organic compound) sealingly contained therein, due to the welding heat produced at a welding portion 16, the organic compound near the welding portion will be vaporized. In order to release any gases resulting from the vaporization outwardly of the container, there is a groove 17 communicated with a communication bore 18, which is in communication with the outside of the container.

The welding portion 16 is defined, as depicted by shading in FIG. 1, along the plane where the container lid 11 and the container body 12 are opposed to each other, and also, along the entire outer periphery of the container. The groove 17 is formed to surround the outside periphery of the sealing material 15. The communication bore 18 extends from the bottom of the groove and through the container body 12, and it opens to the outside at one side face of the container.

For welding the weld structural member lid 11 and the weld structural member body 12 to each other along the welding portion 16 by means of a TIG welding method or a laser welding method, for example, a vacuum is applied to the groove 17 of the container through one or more communication bores 18 to a low vacuum level, of about 100 Pa. As a result, the lid 11 and the body 12 are vacuum attracted to each other and, so, the weld structural member lid 11 and the body 12 become more difficult to move than when the two are vacuum attracted. Furthermore, although a portion of the sealing material 15, close to the welding portion, will be vaporized by the welding heat, during the welding, gases resulting from the vaporization do not leak through the welding portion 16, but rather, the gases leak through the communicating bore and bores 18. This effectively reduces formation of pinholes or blow holes at the welding portion 16.

After the welding, a helium leak test tube may be connected to the communicating bore 18 of the container to check for any leakage of helium gas (for a gas leakage test). Once the welding position, where the gas leakage is occurring, is detected, such a portion may be re-welded and, thereafter, the communicating bore 18 may be closed. Through the re-welding and closure of the communicating bore 18 described above, production of outgas from the vacuum welded article, when it is placed in a vacuum ambience, can be reduced significantly. The container itself may be tightly closed (as will be described with reference to a post-process of the communicating bore 18), or alternatively, a temperature-adjusting pipe may be connected thereto, while using the communicating bore 18 and the groove 17, for temperature adjustment thereof.

Figure 2A:
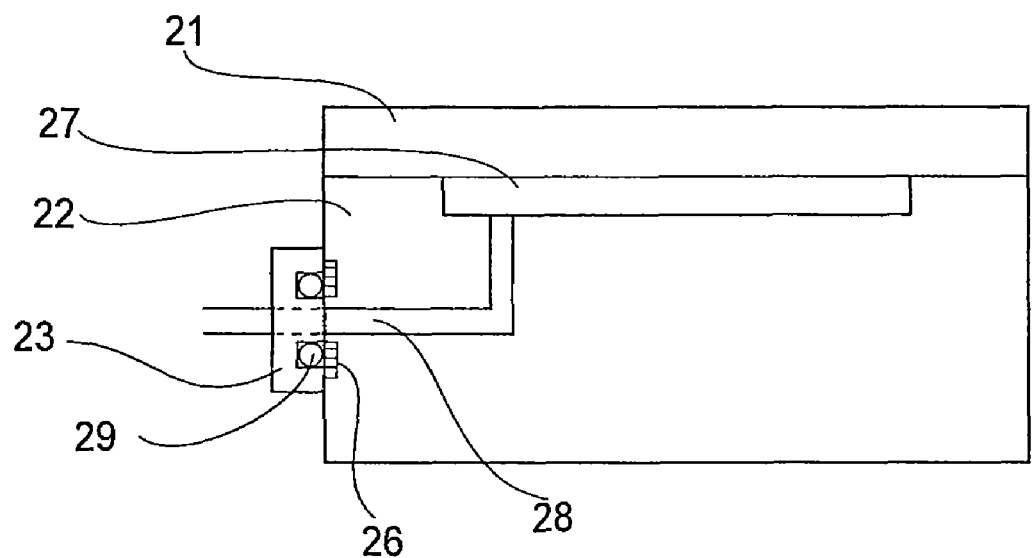
Figure 2B:
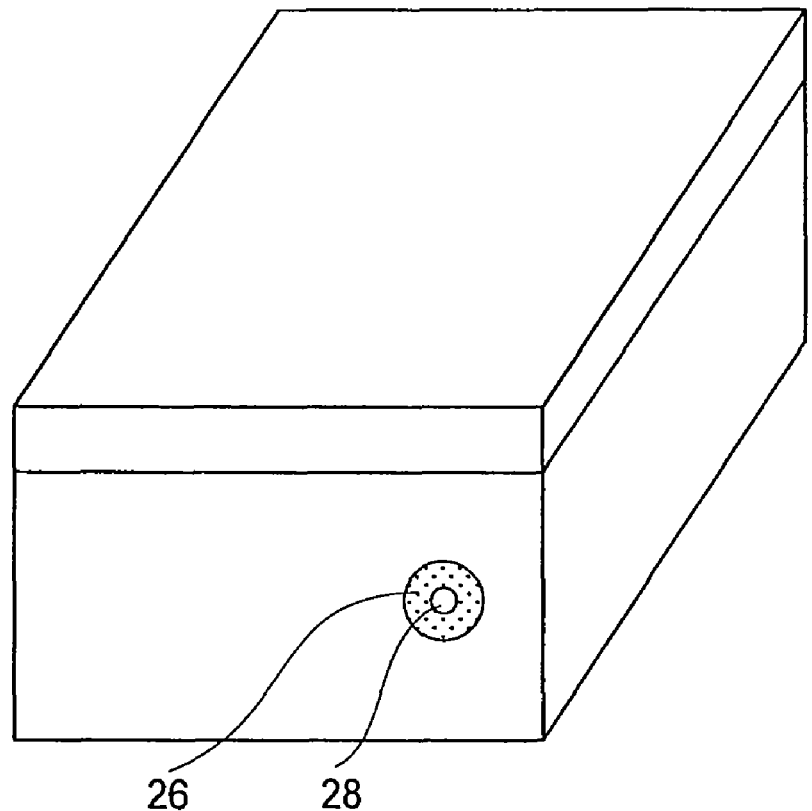

FIG. 2A is a sectional view taken along a plane A in FIG. 1, showing the container in a state that the weld structural member lid 11 is welded to the weld structure member body (tray) 12 of FIG. 1. In the example shown in FIG. 2A, the structure includes a sealingly closing member 23 having an O-ring. The closing member 23 has an O-ring groove, which is provided so that a communicating portion 28 (FIG. 2A), and an outside exit portion, can be sealed by means of the O-ring 29. FIG. 2B illustrates the container in the state that the weld structural members of FIG. 1 before the welding have been welded to each other. Specifically, FIG. 2A depicts the position of a ring- or spring-machining portion 26 around the communicating bore 28. In a case when the closing member 23 has an O-ring 29 and an O-ring groove, the weld structural member body 22 may be ring- or spring-machined concentrically at location 26, so as to prevent formation of any scratches extending radially from the communicating bore, upon the surface to be contacted to the O-ring 29. In the example of FIGS. 2A and 2B, a pipe extends outwardly, such that the closing member 23 can sealingly close the container, and that the inside of the groove 27 can be vacuum-sucked for a leakage check. The left-hand end portion of the pipe projected from the closing member 23 in FIG. 2A may be connected to a helium leakage detector and a helium gas may be blown toward around the welding portion (welding portion 16 in FIG. 1), between the lid 21 and the body 22. If there is any point where the helium density as detected by the helium detector rises, it means that, at such point, the container inside is communicated with the outside. Thus, re-welding may be carried out with respect to that point, by means of the TIG welding method or laser welding method. Once this is done, the outgas reliability of the vacuum welded component can be raised significantly. Although, in this embodiment, a rubber O-ring is used to seal the communicating bore 28, the seal may be made by using a metal O-ring or a gasket, for example.

Figure 3:
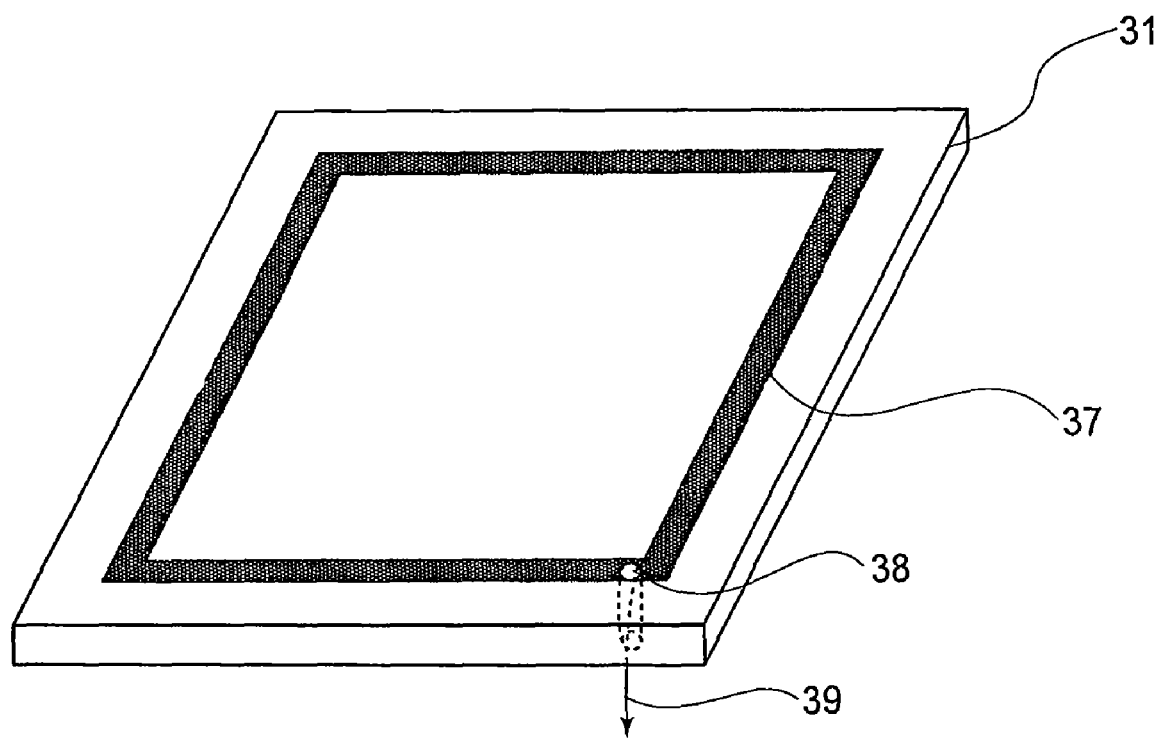
FIG. 3 is a perspective view, showing an example wherein a lid member of a container according to the first embodiment is provided with a groove.

Furthermore, while in FIG. 1, the groove and the bore are provided at the container body 12 side wherein a solid material is sealingly contained, they may be formed at the lid 11 side. This is particularly so, because the portion of the weld structural member body 12 where the groove 17 is formed may be easily deformed by a stress, and the machining is not easy to do. In consideration of this, the lid may be formed with a thickness sufficient to allow cutting the groove and thus, enable the groove to be formed in the weld structural member lid. FIG. 3 illustrates such an example. FIG. 3 illustrates the lid 11 portion of the weld structural member shown in FIG. 1, when the same is seen from below. As illustrated, a weld structural member lid 31, which corresponds to the lid 11 of FIG. 1, is provided with a groove 37 and a communicating bore 38, being in communication with the outside, while extending toward the bottom face (in FIG. 3), which correspond to the groove and the communicating bore formed in the weld structural member body of FIG. 1. With this arrangement, any gases in the groove can flow outwardly along a flowpassage 39.

Embodiment 2

A second embodiment of the present invention will be described with reference to an example wherein pipe means is provided around a groove for releasing any gases produced by evaporation of a sealing material. Generally, a portion of the sealing material, which is closest to the welding portion, is most easily vaporized. If the structure is made of a material or materials having even heat conductivity, heat is conducted rectilinearly. So, in order to prevent heat transfer to such a portion where vaporization can occur easily, a cooling pipe may be disposed between the welding portion and the sealing material to cool the pipe means, to thereby make the welding heat smaller. By doing so, vaporization of a solid material sealingly contained in the weld structural member due to welding heat can be prevented. Specifically, FIGS. 4A and 4B and FIGS. 5A and 5B illustrate containers arranged such as above. With this arrangement, welding heat can be released outwardly more effectively and efficiently, particularly, as compared with conventional methods wherein a metal block, such as copper having good heat conductivity, is disposed adjacent to the welding portion during the welding operation, so that the welding heat is accumulated in the block. With these embodiments, therefore, transfer of welding heat to the inside sealing material can be reduced much more. Furthermore, when a heat generating member, such as an electromagnet, for example, is disposed inside the welded structural member after the welding is completed, any heat emitted from the electromagnet, or the like, can be released outwardly of the finished structural member through the cooling pipe means.

Figure 4A:
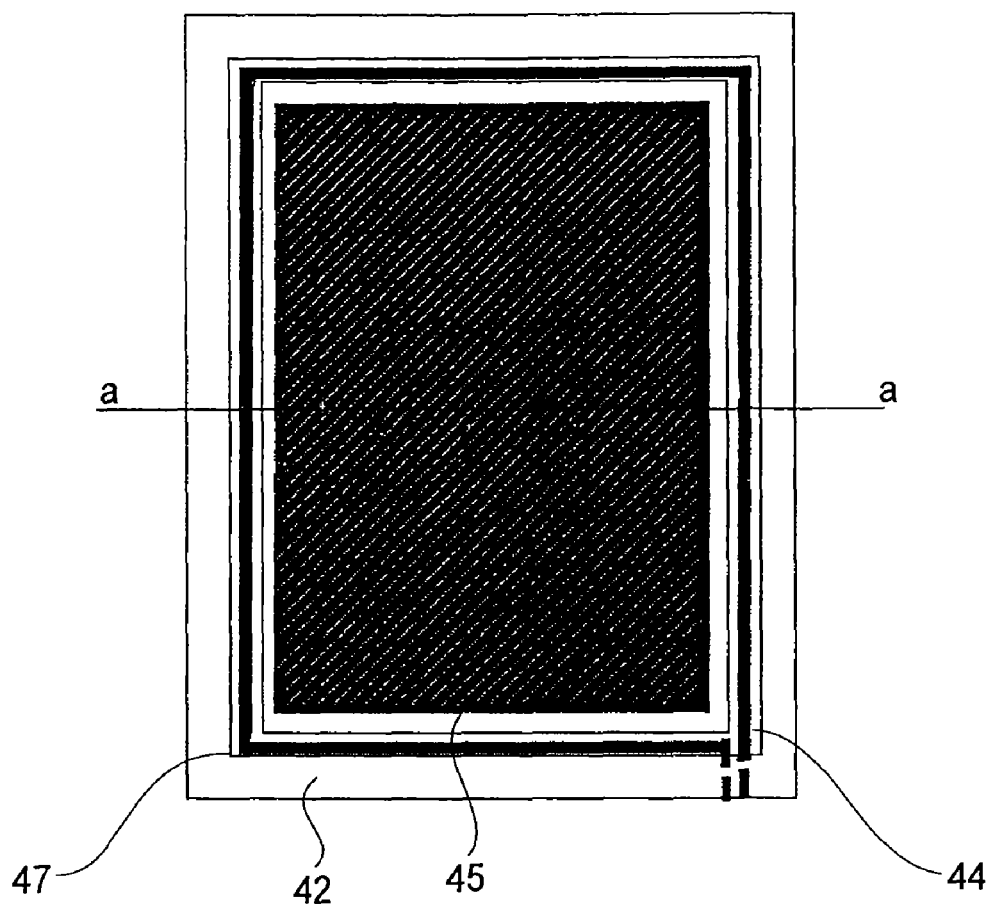
Figure 4B:
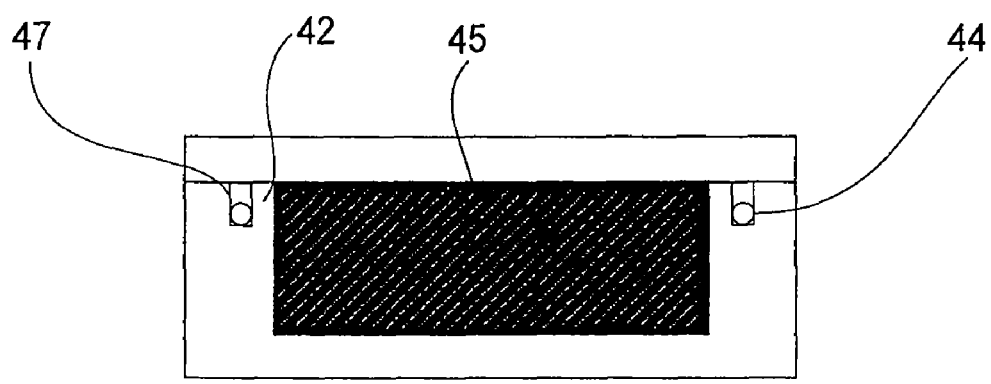
Figure 5A:
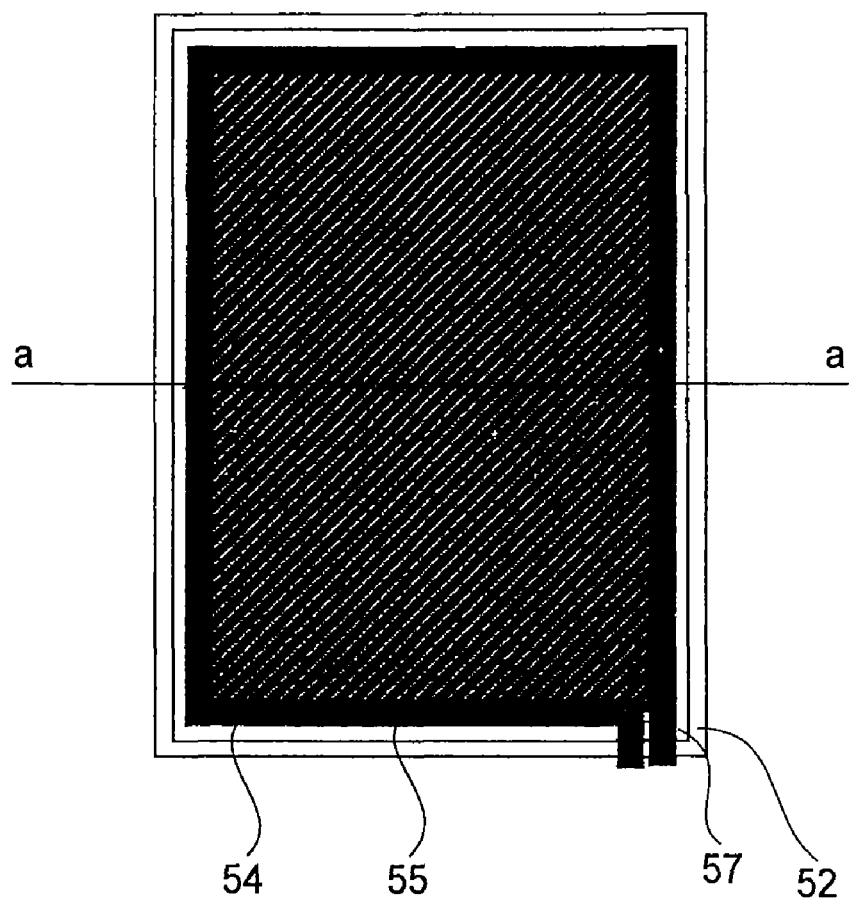
Figure 5B:
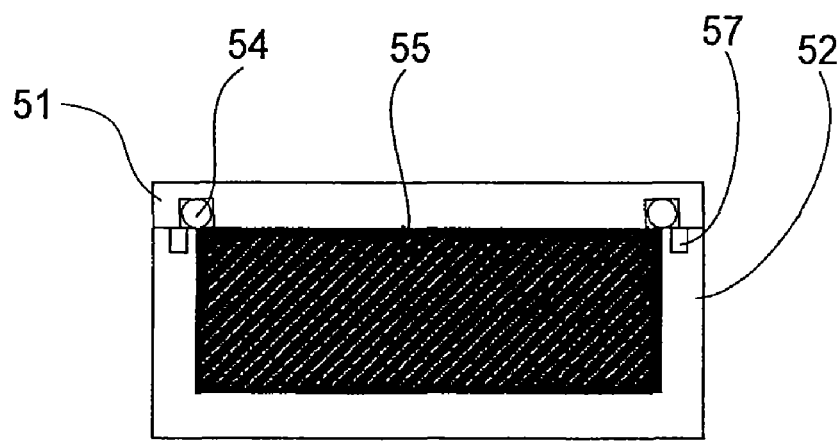

FIGS. 4A and 5A both illustrate the weld structural member except for the lid thereof. FIGS. 4B and 5B are a sectional view taken on a line a-a in FIG. 4A or 5A. Thick lines in these drawings (at 44 in FIGS. 4A and 4B and at 45 in FIGS. 5A and 5B) illustrate the cooling pipe.

FIGS. 4A and 4B show a case wherein the cooling pipe 44 is provided at the weld structural member body 42 side and, in this example, the cooling pipe 44 is disposed inside the groove 47 of the weld structural member. FIGS. 5A and 5B show a case wherein the cooling pipe 54 is provided in the weld structural member lid 51.

In the case of FIGS. 4A and 4B, wherein the cooling pipe is disposed in the weld structural member body 42, the operation can be easier, as compared with the case of FIGS. 5A and 5B, wherein the cooling pipe is provided in the weld structural lid member 51 (this necessitates cutting the lid to make the groove and embedding the cooling pipe therein). However, when the cooling pipe 54 is embedded in the lid, as shown in FIGS. 5A and 5B, the groove 57 formed in the body 52 can be made smaller than the cooling pipe and, therefore, the frame thickness of the weld structural member body 42 can be made smaller. The size of the weld structural member body 42 can, therefore, be made smaller. Inversely, the groove may be formed in the weld structural member lid, while the cooling pipe may be disposed in the weld structural member body.

Anyway, when the groove and the cooling pipe are provided close to each other, as in the cases of FIGS. 4A-5B, the cooling pipe should have a structural feature that, upon application of a vacuum to the groove, the pipe will not be collapsed, even if the inside pressure is larger than the outside pressure, by one atmosphere.

Embodiment 3

Figure 6:
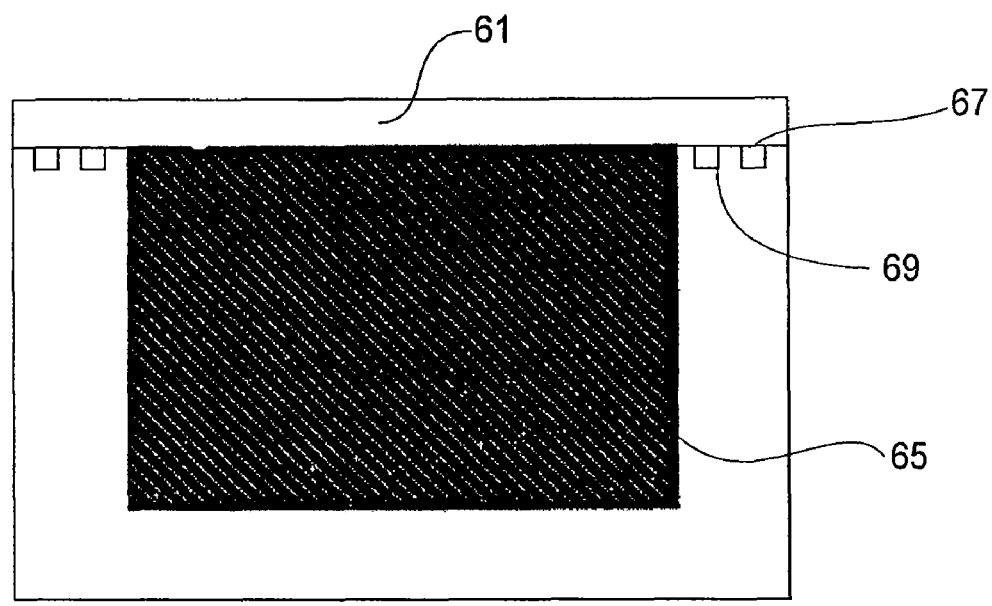
FIG. 6 is a sectional view of a container according to a third embodiment of the present invention, wherein an additional groove is provided between a groove of the container and a solid material.

Next, a third embodiment of the present invention will be described. FIG. 6 illustrates an example wherein an additional groove 69 is provided between a sealing material 65, tightly contained and a groove 67, which functions to release any gases produced by vaporization of the sealing material contained inside the weld structural member. If the weld structural member lid is made thin and air is present inside the vacuum weld structure, particularly, between the lid thereof and the sealing material, decreasing the outside pressure will apply a pressure of one atmosphere to the thin lid member, and it may cause deformation of the shape of the weld structural member. In consideration of this, an adhesive agent is applied between the weld structural member lid 61 and the solid material sealingly contained in the container, so as to keep the lid and the sealing member fixed. As a result of application of the adhesive agent, inside air is difficult to be collected between the lid and the sealing material. Furthermore, in this embodiment, in order to prevent the adhesive agent from being spread toward the welding portion to clog the groove and to interrupt communication of the groove with the outside, an additional groove 69 is provided between the groove 67 and the sealing material 65.

Containers according to the first to third embodiments described hereinbefore can be used to encase any vacuum-resisting structural device. An example of such a structural device is a motor, which is to be used in a vacuum ambience. To provide the function as a motor, such a structural device may include internal components, such as a coil, an iron core and magnets, for example. In order to keep these internal components immovable, to prevent a shift of them, a resin or any other material may be applied around these components. The finished structural device having these internal components is then put into a chamber. In order to maintain a high vacuum inside the chamber, the surface to be contacted to the outside of the structural device may preferably be made of a metal, rather than an organic compound that easily produces outgases. Furthermore, in order to prevent leakage of outgases from an inside resin material, or the like, through the cemented surface, it is important to assure complete sealing.

Embodiment 4

Figure 7:
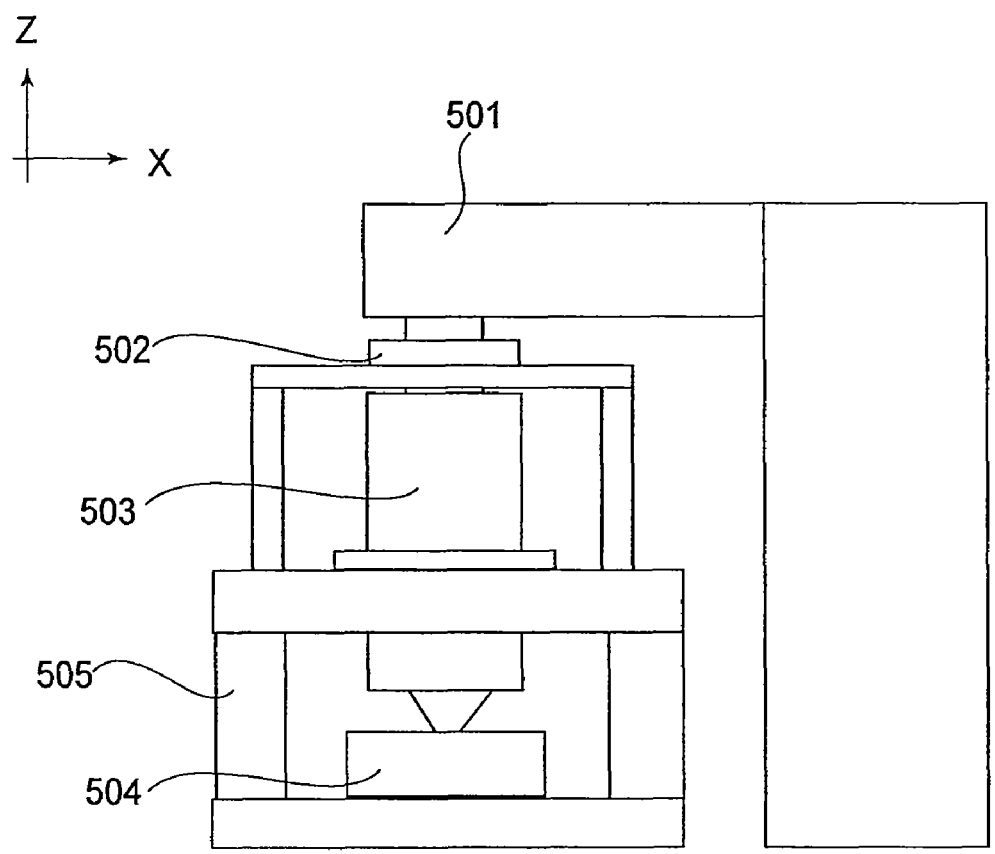
FIG. 7 is a schematic view of an exposure apparatus to which the present invention is applied.

Next, an example of an exposure apparatus to which the present invention can be applied will be explained as a fourth embodiment of the present invention. FIG. 7 shows such an exposure apparatus that comprises an illumination device 501, a reticle stage 502 having a reticle placed thereon, a projection optical system 503, and a wafer stage 504 having a wafer placed thereon. These components are supported by a supporting structure 505. This exposure apparatus is arranged to project a circuit pattern formed on a reticle onto a wafer, through exposure. It may be based on a step-and-repeat projection exposure method or a step-and-scan projection exposure method. Here, at least a portion of the exposure apparatus is disposed inside a vacuum chamber having an inside space kept at a high vacuum level. A container according to any one of the first to third embodiments described hereinbefore may be used to encase those component members disposed inside the vacuum chamber. Such component members may include linear motors for driving the wafer stage and/or the reticle stage, or a piece of such an element (e.g., a coil). By using a container according to any one of the first to third embodiments, an undesirable decrease of vacuum level due to outgases from the component members can be prevented.

The illumination device 501 serves to illuminate a reticle having a circuit pattern formed thereon, and it includes a light source unit and an illumination optical system. The light source unit may include a laser, for example, as a light source. The laser may be an ArF excimer laser having a wavelength of about 193 nm, a KrF excimer laser having a wavelength of about 248 nm, or an $F_2$ excimer laser having a wavelength of about 153 nm, for example. However, the laser is not limited to excimer lasers. A YAG laser may be used, as an example. Further, the number of lasers used is not restricted. When a laser is used as a light source, preferably, the exposure apparatus may further comprise a light beam shaping optical system for shaping parallel light from the laser light source into a desired beam shape, and an incoherent-transforming optical system for transforming a coherent laser beam into an incoherent laser beam. Furthermore, usable light sources in the light source unit are not restricted to lasers. For example, one or more lamps, such as Hg lamps or Xenon lamps, may be used.

The illumination optical system is an optical system for illuminating a mask, and it may comprises lenses, mirrors, light integrators, and stops, for example.

The projection optical system 503 may be an optical system consisting of plural lens elements only, an optical system having plural lens elements and at least one concave mirror (that is, a catadioptric optical system), an optical system having plural lens elements and at least one diffractive optical element, such as a Kinoform, for example, or an all-mirror type optical system, for example.

The exposure apparatus such as mentioned above may be used for the manufacture of microdevices having very fine patterns formed thereon, such as semiconductor devices (e.g., semiconductor integrated circuits), micromachines, or thin-film magnetic heads, for example. In accordance with this embodiment of the present invention, an exposure apparatus having a very high reliability with respect to a high vacuum can be provided.

Embodiment 5

Next, an embodiment of a semiconductor device manufacturing method, which uses an exposure apparatus described above, will be explained as a fifth embodiment of the present invention.

Figure 8:
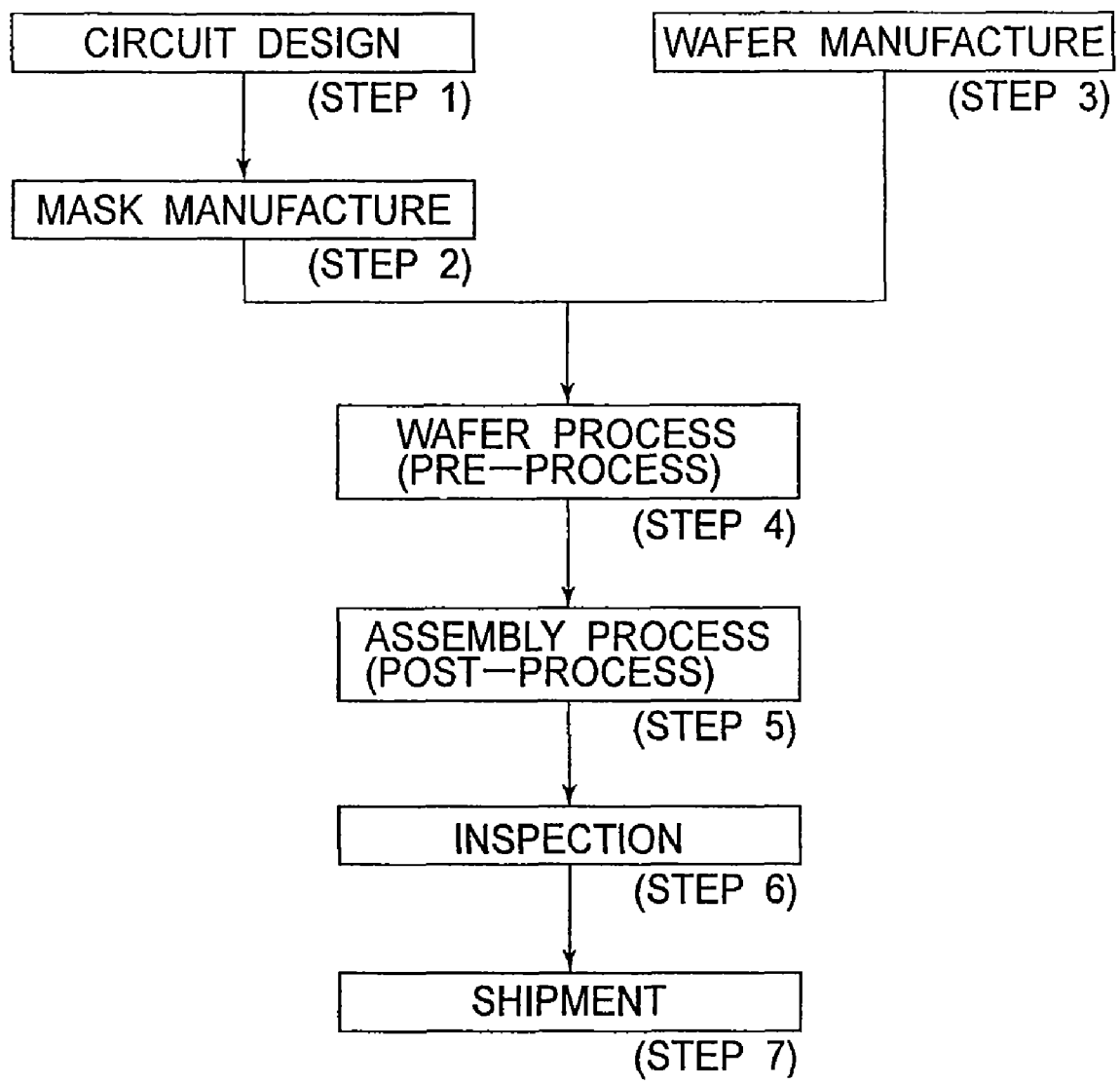
FIG. 8 is a flow chart for explaining a general manufacturing procedure for the production of semiconductor devices.

FIG. 8 is a flow chart for explaining a general procedure of manufacturing semiconductor devices. Step 1 is a design process for designing a circuit of a semiconductor device. Step 2 is a process for making a mask on the basis of the circuit pattern design.

On the other hand, Step 3 is a process for preparing a wafer by using a material, such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check and so on, for the semiconductor devices produced by step 5, are carried out. With these processes, semiconductor devices are produced, and they are shipped (step 7).

Figure 9:
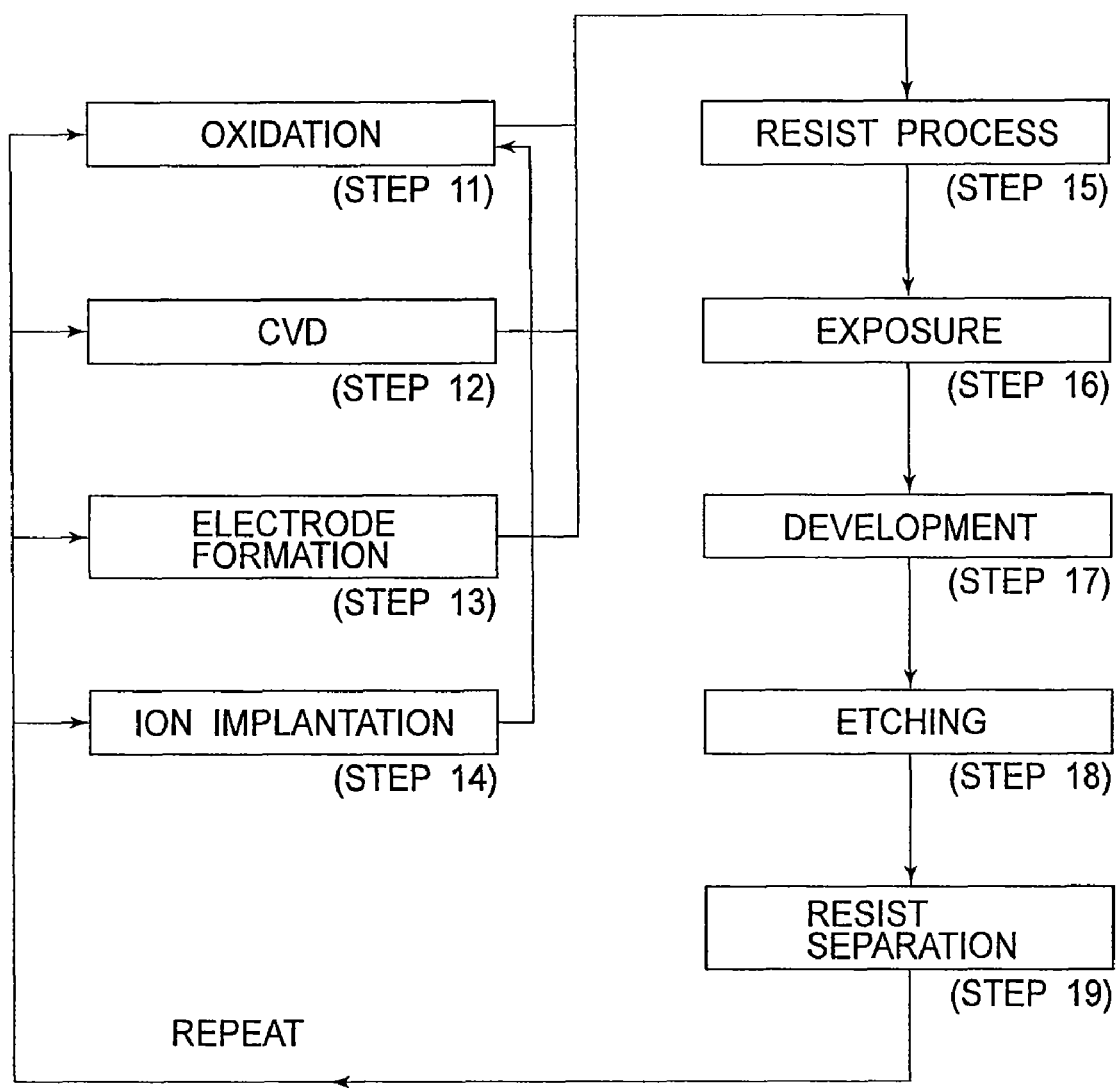
FIG. 9 is a flow chart for explaining details of a wafer process in the procedure of FIG. 8.

The wafer process at Step 4, described above, includes a few steps, as depicted in FIG. 9. Namely, Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of forming a container having a lid and a container body which define an inside space, and a material containing an organic compound provided in the inside space, said method comprising:

forming a groove and a communication member, for communicating the groove with an outside space, in at least one of the lid and the container body;

providing the material in the inside space;

welding the lid and the container body to each other; and exhausting the organic compound vaporized by welding heat to the outside space through the groove and the communication member.

2. A method according to claim 1, wherein the welding is carried out while applying a vacuum to the groove through the communication member.

3. A method according to claim 1, further comprising connecting a leakage check detector to the communication member, and welding a leak portion in the welded portion found by the leakage check.

4. A method according to claim 1, further comprising a shutoff step for shutting off the communication member.

* * * * *